United States Patent [19]
Yatsuo et al.

[11] 3,947,864
[45] Mar. 30, 1976

[54] DIODE-INTEGRATED THYRISTOR

[75] Inventors: Tsutomu Yatsuo; Tatsuya Kamei; Koichi Wajima, all of Hitachi, Japan

[73] Assignee: Hitachi, Ltd., Japan

[22] Filed: Feb. 5, 1974

[21] Appl. No.: 439,717

[30] Foreign Application Priority Data
Feb. 12, 1973 Japan.............................. 48-16595

[52] U.S. Cl..................... 357/39; 357/58; 357/64; 357/86; 357/49
[51] Int. Cl.²........................................ H01L 29/747
[58] Field of Search............ 357/38, 39, 49, 58, 64, 357/86, 88, 90

[56] References Cited
UNITED STATES PATENTS

| | | |
|---|---|---|
| 3,236,698 | 2/1966 | Shockley.............................. 357/38 |
| 3,405,332 | 10/1968 | Svedberg et al. ...................... 357/38 |
| 3,440,114 | 4/1969 | Harper.................................. 357/64 |
| 3,727,116 | 4/1973 | Thomas et al. ........................ 357/38 |

*Primary Examiner*—Stanley D. Miller, Jr.
*Assistant Examiner*—Joseph E. Clawson, Jr.
*Attorney, Agent, or Firm*—Craig & Antonelli

[57] ABSTRACT

A diode-integrated thyristor comprising a region having a function of a thyristor and a region having a function of a diode which are integrated in the same semiconductor substrate and whose rectifying directions are opposite to each other, the carriers in the region having the function of a diode having a longer life time than the carriers in the region having the function of a thyristor.

18 Claims, 13 Drawing Figures

DIODE-INTEGRATED THYRISTOR

The present invention relates to a diode-integrated thyristor in which a thyristor and a diode are integrated in a semiconductor substrate, in a reversely parallel connection.

In a chopper or an inverter circuit used for the speed control of an electrically driven vehicle or in a horizontal deflection circuit for a television receiver, for example, a combination of a thyristor and a diode connected reversely in parallel with each other is used. If such a combination is replaced by a diode-integrated thyristor having such a structure as described above, then the overall circuit can be reduced in the number of circuit elements, and therefore in size and cost can be reduced. Moreover, such a replacement can make the circuit ready for use in high frequency application where the inductances of and between the wirings of the discrete circuit elements incur fatal effects. The diode-integrated thyristor in question, however, a problem of "erroneous turn-on" must first be solved. Namely, if the thyristor is forwardly biased while the diode is within its recovery time after its forward conduction, then the thyristor may erroneously conduct without any gate signal, due to the influence by the diode. How the wrong turn-on is caused will be described with the aid of FIG. 1 (PRIOR ART).

In FIG. 1a, a semiconductor substrate 1 consists of four layers, i.e., an N emitter layer $N_E$, a P base layer $P_B$, an N base layer $N_B$ and a P emitter layer $P_E$, the letters N and P indicating the N- and P-type conductivities, respectively. The N emitter layer $N_E$, the P base layer $P_B$, the N base layer $N_B$ and the P emitter layer $P_E$ define a thyristor region 11, while the N base layer $N_B$ and the P base layer $P_B$ constitute a diode region 12. A pair of main electrodes 2 and 3 are formed on and in ohmic contact with the surfaces of the N emitter and the P base layers $N_E$ and $P_B$ and the surfaces of the P emitter and the N base layers $P_E$ and $N_B$, and connect the thyristor region 11 and the diode region 12 in reversely parallel with each other. A gate electrode 4 is formed on the P base layer $P_B$ of the thyristor region 11. FIG. 1b is an equivalent circuit of the diode-integrated thyristor shown in FIG. 1a.

In the diode-integrated thyristor of this type, when a voltage is applied between the main electrodes 2 and 3 with the electrode 3 maintained at a higher potential than the electrode 2 (i.e. the thyristor region 11 is forwardly biased and the diode region 12 reversely biased), the P-N junction between the P base layer $P_B$ and the N base layer $N_B$ is reversely biased so that both the thyristor region 11 and the diode region 12 are cut off since they now have high inpedances. If a signal for gating is additionally applied to the gate electrode 4, the thyristor region 11 is driven into conduction. Now, when the polarity of the voltage between the main electrodes 2 and 3 is inverted, only the diode region 12 is conductive since the PN junctions between the N emitter layer $N_E$ and the P base layer $P_B$ and between the P emitter layer $P_E$ and the N base layer $N_B$ are inversely biased while the PN junction between the P base layer $P_B$ and the N base layer $N_B$ is forwardly biased. The current characteristic in this case is as shown in FIG. 1c. Then, let the case be considered where the polarity of the voltage between the main electrodes is so inverted that the diode region 12 may change from its conducting state to its cut-off state. In the conducting state, in the diode region 12, a great many holes are injected from the P base layer $P_B$ into the N base layer $N_B$ and stored as excess minority carriers in the N base layer $N_B$. Some of those carriers still remain in the N base layer $N_B$, forming residual carriers, even after the current through the diode region 12 has ceased. Also, some of the residual carriers are drawn back to the main electrodes due to the voltage applied between the main electrodes while the others diffuse in every direction and vanish through recombination. When all the residual carriers are disappeared, the diode region 12 recovers its cut-off state. In this case, however, some of the residual carriers reach and diffuse into the thyristor region 11 before vanishing through recombination, so that they exert an influence, like one of the gate signal, upon the thyristor region 11, turning the region 11 on before reception of the gate signal. Thus, the thyristor region 11 is said to have been erroneously turned on. The greater are the current decreasing rate $di/dt$ and the peak current through the diode region 12, the more often this erroneous turn-on operation occurs. For, it the current decreasing rate $di/dt$ is greater, the time during which the current decreases to zero is shorter so that a larger part of the stored carriers is left behind while if the peak current is larger, the number of the stored carriers is greater so that the number of the residual carriers is greater. This erroneous turn-on phenomenon lowers the ratings in current and voltage of the diode integrated thyristor and deters the recovery time of the diode region 11 from being shortened, so that the control capacity and efficiency of the circuit using the diode-integrated thyristor is degraded. The conventional method to prevent such an erroneous turn-on is to provide an isolation portion between the thyristor region 11 and the diode region 12 to isolate one from the other. Such an isolation portion may be formed, for example, by (1) extending one of the emitter layers of the thyristor region farther toward the diode region side than the other emitter layer by a sufficient distance, (2) forming a high impurity concentration layer in at least one of the bases of the diode region, spaced apart from the thyristor region by a sufficient distance or (3) splitting at least one of the main electrodes into two electrode portions near the boundary in such a manner that the two electrode portions are separated from each other by a sufficient distance. The details of such techniques are disclosed in U.S. patent application Ser. No. 55,313, filed July 16, 1970.

The provision of the isolation portion, however, does not lead directly to the realization of a diode-integrated thyristor well adapted for use in a chopper circuit, an inverter circuit or a horizontal deflection circuit of a television receiver. There still remain a few problems to be solved. The first problem is that of the isolation effect due to the isolation portion. Namely, in order to completely prevent the residual carriers from diffusing into the thyristor region, the width of the isolation portion, i.e. the distance of the isolation between the thyristor region and the diode region, must be extremely large, or the PN junction between the P and N bases must be split into two portions, i.e. a thyristor PN junction and a diode PN junction. Accordingly, the current and voltage capacities and the maximum operating temperature of the element are limited to rather small values. The second problem is that of excess recovery current through the diode region. In the actual operation of the diode-integrated thyristor, it often occurs that the thyristor region is forwardly biased again just after a large current has flowed through the diode region. When forwardly biased, the thyristor region need to have an ability to block the forward voltage. The ability to block the forward voltage applied again to the thyristor region during the commutation period depends on the rate $dv/dt$ of increase in the applied voltage and the smaller is the rate $dv/dt$, the easier is the blocking of the voltage. It is therefore necessary to design the circuit in such a manner that the rate $dv/dt$ is as small as possible. Usually, in order to reduce the rate $dv/dt$, a series circuit of a capacitor and a resistor is connected in parallel between the main electrodes of the diode-integrated thyristor, as shown in FIG. 2. (PRIOR ART). The recovery current which flows from the main electrode 3 toward the main electrode 2 after a large current has flowed through the diode region, tends to increase until the PN junction in the diode region recovers the blocking ability. As soon as the blocking ability has been restored, the recovery current begins attenuating and simultaneously the circuit current takes its route through the C-R series circuit so that the capacitor C starts to be charged. At this time, a forward voltage having a steep rising appears across the main electrodes of the thyristor region due to the voltage drop across the resistor R. This forward voltage can be small if the resistance of the resistor R is small. However, if the resistance is made small, then the current due to the charges released from the capacitor C, when the thyristor region turns on by a gating signal, becomes large and the induced heat may injure the thyristor region, Therefore, the resistance of the C-R series circuit connected in parallel to the diode-integrated thyristor cannot be made too small without regard to the power to be switched on and off by the thyristor region. In the diode-integrated thyristor in which a large current flows through the diode region, the erroneous turn-on associated with $dv/dt$ cannot be prevented by the mere provision of the C-R series circuit in parallel with the element. Consequently, the commutating characteristic cannot be improved to a satisfactory extent.

A saturable reactor may be connected in series with the diode-integrated thryistor, to reduce the peak value of the recovery current and the rate $di/dt$ of change in current during the recovery time of the diode region. The saturable reactor serves to reduce the rate $di/dt$ of decrease in current flowing through the diode region near the time when the current is commutated, the number of residual carriers existing during the recovery time and the peak level of the recovery current so that $dv/dt$ after the recovery of the diode region ($dv/dt$ of the voltage applied to the thyristor region) is also decreased. In this case, however, the recovery time in the diode region is rather long and therefore the commutation period is prolonged so that the range of controllable frequencies is limited to a low frequency. Moreover, if the number of the stored carriers in the diode region is so large, the saturable reactor is saturated during the recovery time of the diode region. Accordingly, from the time of saturation on, the recovery current increases rapidly and the thyristor region is erroneously turned on.

The second problem of the diode-integrated thyristor is the unevenness of the recovery times of the diode regions. If a plurality of diode-integrated thyristors connected in series which have different recovery times are operated, an excessive voltage is imposed upon a diode-integrated thyristor having the shortest recovery time, leading the thyristor to destruction. On the other hand, if a plurality of diode-integrated thyristors are used, connected in parallel, then the rates $dv/dt$ of increase in the forward voltages applied to the respective thyristor regions vary and that thyristor region which has the longest recovery time is erroneously turned on. If a large current flows through each diode region and/or if the rate $di/dt$ of decrease in the current is large, there are left a great many residual carriers, as described above. The residual carriers largely affect the recovery times of diode regions and the diodes having residual carriers will have a variety of recovery times. Moreover, in the case where a saturable reactor is connected with each diode-integrated thyristor, the recovery times increase, as described above, so that the unevenness of them will also be accompanied. In conclusion, the problem of the unevenness of the recovery times cannot be prevented where several diode-integrated thyristors are used, connected in series or parallel.

It is a first object of the present invention to provide a novel diode-integrated thyristor which is free from the adverse influence on the thyristor region during commutation by the residual carriers in the diode region.

A second object of the present invention is to provide a novel diode-integrated thyristor in which the recovery time is reduced by reducing the residual carriers in the diode region.

A third object of the present invention is to provide a novel diode-integrated thyristor which has a rather constant recovery time.

A fourth object of the present invention is to provide novel diode-integrated thyristors which can be used in series or parallel connections with one another.

A fifth object of the present invention is to provide a novel diode-integrated thyristor well adapted for use in a chopper or an inverter circuit, or a horizontal deflection circuit of a television receiver.

A sixth object of the present invention is to provide a novel diode-integrated thyristor which can withstand the very rapid rate of increase in the forward voltage applied across the thyristor region during the commutation from diode to thyristor region.

Other objects, features and advantages of the present invention will be apparent from the following description of the embodiments as shown in the accompanying drawings, in which:

FIGS. 1 and 2 are included for the purpose of explaining the prior art diode-integrated thyristor, FIG. 1a being a cross section of a conventional diode-integrated thyristor, FIG. 1b being an electrical equivalent circuit of the thyristor shown in FIG. 1a and FIG. 1c showing the voltage-current characteristics of the thyristor shown in FIG. 1a, and FIG. 2 illustrating a means for decreasing $dv/dt$ during commutation;

In the following, the present invention will be described by way of embodiments with the aid of the accompanying drawings.

Figure 3:
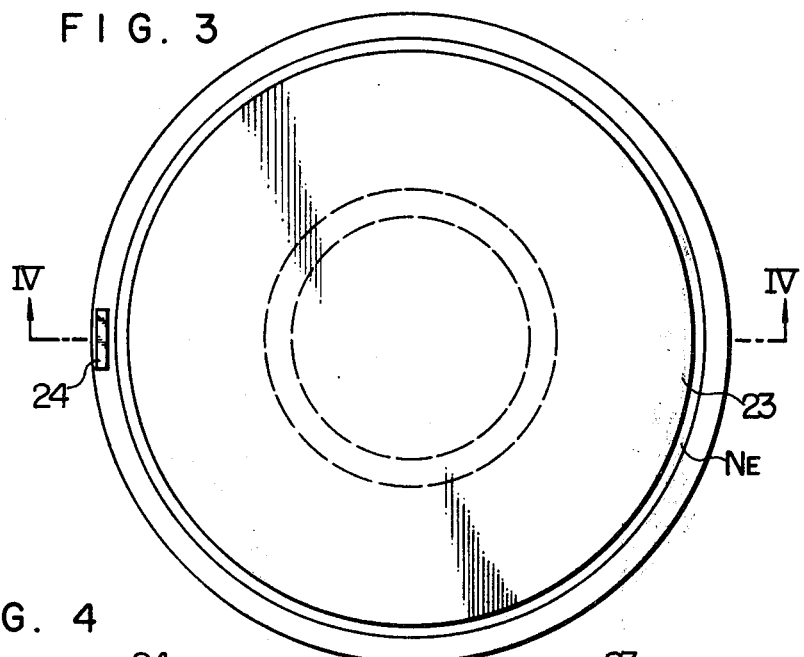
FIG. 3 is a plan view of a diode-integrated thyristor as one embodiment of the present invention.
Figure 4:
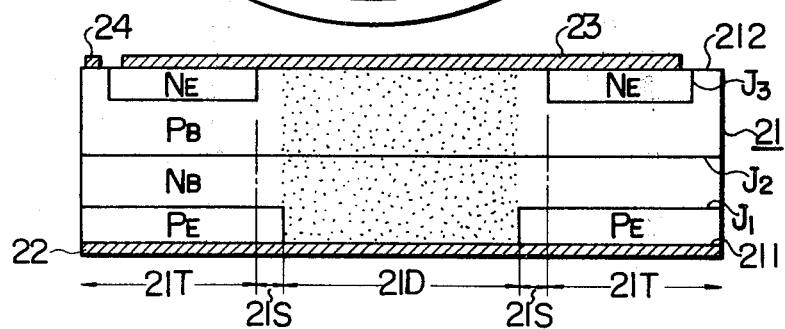
FIG. 4 is a cross section taken along line III – III in FIG. 3.

FIGS. 3 and 4 show a first embodiment of the present invention. In this embodiment, the atoms of a material to form a recombination center are distributed only in the diode region of the diode-integrated thyristor so that the life time of the carriers in the diode region is shorter than that of the carriers in the thyristor region. Namely, a semiconductor substrate 21 has two principal surfaces 211 and 212 parallel to each other and is in a four-layer structure consisting of four layers having alternate conductivity types, i.e. P emitter layer $P_E$, N base layer $N_B$, P base layer $P_B$ and N emitter $N_E$. PN junctions $J_1$, $J_2$ and $J_3$ are formed between the layers having different conductivity types.

The P emitter layer $P_E$ and N emitter layer $N_E$ are so formed in the surfaces of the N and P base layers $N_B$ and $P_B$ and near peripheries of them that one surface of each of the N and P emitter layers $N_E$ and $P_E$ may be exposed. Moreover, the layers $N_E$ and $P_E$ are formed so as to approximately overlap when projected in the extending direction of the pair of principal surfaces. Thus, a four-layer region (referred to as a thyristor region) 21T consisting of such layers $P_E$, $N_B$, $P_B$ and $N_E$ as described above and having a function of thyristor and a two-layer region (referred to as a diode region) 21D consisting of the P and N base layers $P_B$ and $N_B$ and having a function of a diode, are defined. The P emitter layer $P_E$ in the thyristor region 21T has an extended portion 21S, which together with the N and P base layers lying thereon forms a three-layer isolation portion between the thyristor and diode regions 21T and 21D. In the diode region 21D, the atoms of a material for forming a recombination center for carriers, such as Au, Pt, Ni, Cu, Mn, In or Fe, are distributed. A first main electrode 22 on the principal surface 211 is in ohmic contact with the P emitter layer $P_E$ and the N base layer $N_B$ while a second main electrode on the principal surface 212 is in ohmic contact with the N emitter layer $N_E$ and the P base layer $P_B$, and a gate electrode 24 is provided on the surface of the P base layer $P_B$ in the thyristor region 21T. That portion of each principal surface which is occupied by the diode region 21D is usually 1 to 1/5 times that which is occupied by the thyristor region. The adoption of these dimensions is due to the fact that as soon as the diode region has been forwardly biased, current flows through the entire cross sectional area thereof while it takes a certain constant time for the turn-on region to occupy the whole domain of the thyristor region even after a portion of the domain has been turned on by means of the gate electrode. If the circuit current is small or if the rate $di/dt$ of increase in the current when the thyristor region is turned on is small, then it is unnecessary to take into consideration the time during which the turn-on region expands through the thyristor region. In this case, therefore, the areas occupied in the principal surface by the diode and the thyristor regions can be made equal. However, as the circuit current and $di/dt$ increase, the relative area of the thyristor region must be increased accordingly. It has revealed through experiments for applications to various fields that the ratio of the area of the thyristor region to that of the diode region should be preferably chosen to be 1 : 1 – 1/5.

With this structure, the life time of the carriers in the diode region 21D can be made shorter than that of the carriers in the thyristor region 21T. The reduction of the life time of the carriers in the diode region 21D causes not only the decrease in the residual carriers stored in the diode region but also the increase in the speed of the residual carriers vanishing through recombination. Accordingly, the residual carriers, which are diffused from the diode region 21D to the thyristor region 21T upon re-application of forward voltage to the thyristor region 21T and might cause the thyristor region 21T to be erroneously turned on, decreases so that an erroneous turn-on during commutation can be prevented. Moreover, the recovery current in the diode region 21D decreases in accordance with the decreases in the stored residual carriers and the life time of the carriers so that it is possible to decrease the rate $dv/dt$ of increase in the voltage induced upon the re-application of the forward voltage, which could not be moderated through circuit design. This means, therefore, that the withstanding ability against the rate $dv/dt$ of increase in the forward voltage applied to the thyristor region of the diode-integrated thyristor, is improved. In addition, as the number of the stored residual carriers decreases, the unevenness of the recovery times of the diode regions 21D of the completed devices is reduced, so that such a problem of connecting plural devices in series or parallel as described above can be eliminated.

As described above, the present invention has hitherto been described as applied to a diode-integrated thyristor having an isolation portion of three-layer lamination structure consisting of a P emitter layer $P_E$, and N base layer $N_B$ and a P base layer $P_B$, between its diode and thyristor regions. However, the present invention can also be applied to the following modifications.

[MODIFICATION]

Figure 5:
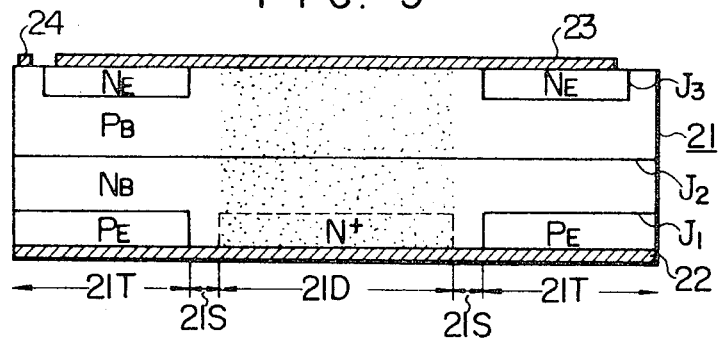
FIGS. 5, 6, 7, 8 and 9 are modifications of the embodiment shown in FIG. 3.

As shown in FIG. 5, a high impurity concentration layer is formed in the N base layer $N_B$ of the diode region 21D of a diode-integrated thyristor, separated apart from the P emitter layer $P_E$ of the thyristor region 21T by a pretetermined distance, and the atoms of a material for forming a recombination center for carriers are distributed through the diode region 21D. Alternatively, such a high impurity concentration layer can be formed in the P base layer $P_B$ or in both the N and P base layers $N_B$ and $P_B$ instead of the N base layer $N_B$.

[MODIFICATION]

Figure 6:
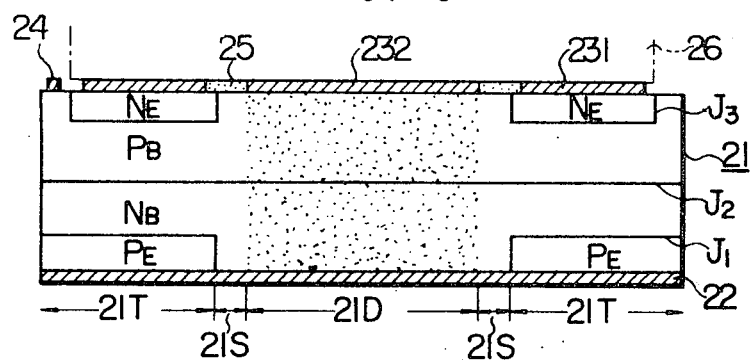

As shown in FIG. 6, the main electrode 23 is split into two electrode portions 231 and 232, the former being in ohmic contact with the thyristor region while the latter being in ohmic contact with the diode region, and the gap between these electrode portions has a predetermined distance so that an isolation portion 21S is formed, and the atoms of a material for forming a recombination center are distributed throughout the diode region 21D. Alternatively, the other main electrode 22 may be split instead of the one 23. The gap is filled with an oxide layer 25. These electrode portions are connected electrically with each other by means of a conducting member 26 kept in contact with or welded to them. Further, in this case, instead of splitting the main electrode, the main electrode may be so shaped as to be embossed at the portion which lies on the oxide film 25 so as to receive the film in the resultant recess.

[MODIFICATION]

Figure 7:
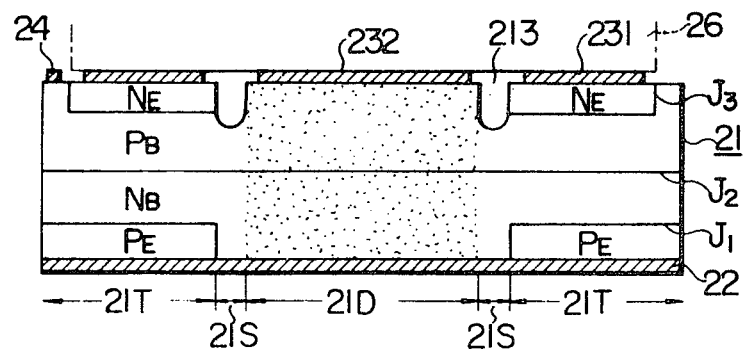

As shown in FIG. 7, a groove 213 having a predetermined width is cut between the diode region 21D and the thyristor region 21T of a diode-integrated thyristor to form an isolation portion 21S and the atoms of a material for forming a recombination center for carriers are distributed throughout the diode region 21D. Another groove may also be formed in the opposite principle surface. In this case, it is unnecessary to split the main electrode and it is only necessary to coat the inner surface of the groove with insulating film or to fill the groove with insulating material, with the insulating film or material overlaid with the electrode.

[MODIFICATION]

Figure 8:
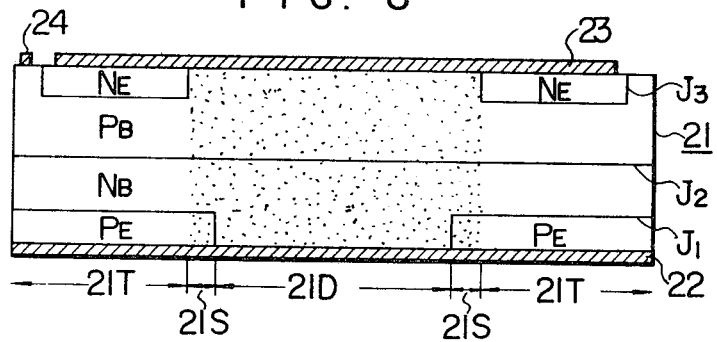

As shown in FIG. 8, the atoms of a material for forming a recombination center for the carriers are distributed throughout the diode region 21D and the isolation portion 21S. The structure of the isolation portion is not limited to that shown in FIG. 8 but may assume one of those shown in FIGS. 5, 6 and 7.

[MODIFICATION]

Figure 9:
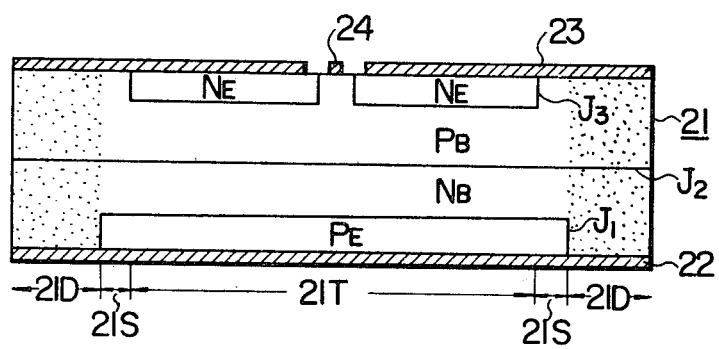

As shown in FIG. 9, the semiconductor substrate 21 has the thyristor region 21T in its central portion and the diode region 21D in its peripheral portion and the atoms of a material for forming a recombination center for carriers are distributed throughout the diode region. The structure of the isolation portion 21S is not limited to that shown in FIG. 9 but may take one of those shown in FIGS. 5, 6 and 7. In addition, the atoms of a material for forming a recombination center for carriers may be doped also in the isolation portion.

[MODIFICATION]

This modification can be obtained by inverting the conductivity types of the respective layers of the diode-integrated thyristor shown in FIG. 3, 4, 5, 6, 7, 8 or 9.

[MODIFICATION]

In the examples shown in FIGS. 3, 4, 5, 6, 7, 8 and 9, the diode region 21D surrounds the thyristor region 21T or vice versa, but the diode-integrated thyristor may be constructed in such a manner that the diode region and the thyristor region are disposed adjacent side by side to each other.

[MODIFICATION]

An isolation portion is formed by doping the atoms of a material for forming a recombination center in an intermediate portion between the diode and thyristor regions, having a predetermined width. Throughout the diode region are doped the atoms of a material for forming a recombination center for carriers, the concentration of the atoms being less than that of the atoms in the isolation portion.

The predetermined width or distance referred to in the descriptions of the first embodiment of the invention and is modifications is defined as the distance long enough to prevent the residual carriers stored in the diode region from diffusing into the thyristor region and causing the thyristor region to erroneously drive conductive.

Figure 10:
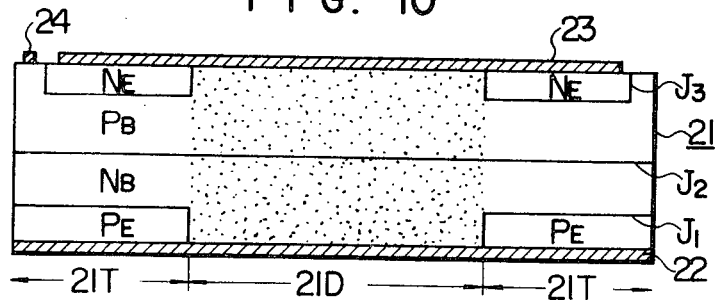
FIGS. 10, 11, 12 and 13 are the cross sections of other embodiment of the present invention.

FIG. 10 shows a second embodiment of the present invention. In the divice of this embodiment, a diode region 21D and the thyristor region 21T are disposed side by side and the atoms of a material for forming a recombination center for carriers are doped only in the diode region so that the life time of the carriers in the diode region may be shorter than that of the carriers in the thyristor region. If the current through the circuit in which the device is inserted (i.e. through the diode region) is small or if the rate $di/dt$ of decrease in the current through the diode region is small, then the commutation characteristic can be improved by merely forming an isolation portion between the diode and thyristor regions. A diode-integrated thyristor used in a circuit which carries a small current and in which the rate of decrease in the current is small, usually has a small capacity and the provision of the isolation portion reduces the area through which current flows so that the utility factor of the semiconductor substrate becomes small. This is a drawback accompanying the provision of the isolation portion which improves the commutation characteristic. Since in this embodiment, the life time of the carriers in the diode region is made shorter than in the thyristor region, the commutation characteristic can be improved without forming any isolation portion and therefore the drawback inherent to the isolation portion can also be eliminated. The structure of this embodiment is not limited to that shown in FIG. 10 but several other modifications will be readily thought of by anyone skilled in the art in view of the preceding embodiment and its modified forms.

Figure 11:
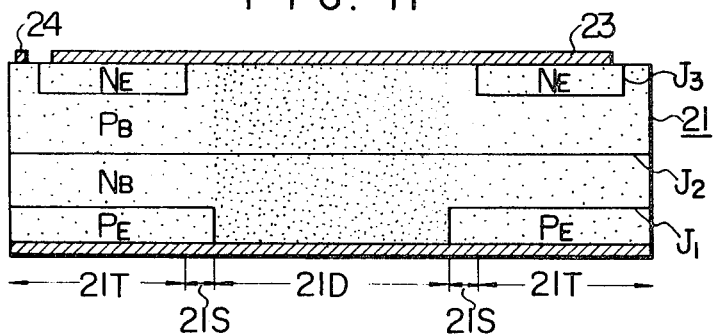

FIG. 11 shows a diode-integrated thyristor as a third embodiment of the present invention. This device is similar to that shown in FIGS. 3 and 4. In this case, however, the whole semiconductor substrate 21 is doped with the atoms of a material for forming a recombination center for carriers, the concentration of the material in the diode region being higher than in the thyristor region. With this structure, the life time of carriers in the diode region 21D can be shorter than that of the carriers in the thyristor region so that this embodiment can enjoy the same effect as the first embodiment. Since in this embodiment, the whole substrate is doped with the material for forming recombination centers, the device can be used in a circuit which is operated at a high frequency (high speed). It is also possible to modify this embodiment as in the case of the first embodiment. Namely, in each of the structures of the diode-integrated thyristors as the first to ninth modification of the first embodiment, the whole semiconductor substrate can be doped with a material for forming a recombination center for carriers in such a manner as followed in this third embodiment.

Figure 12:
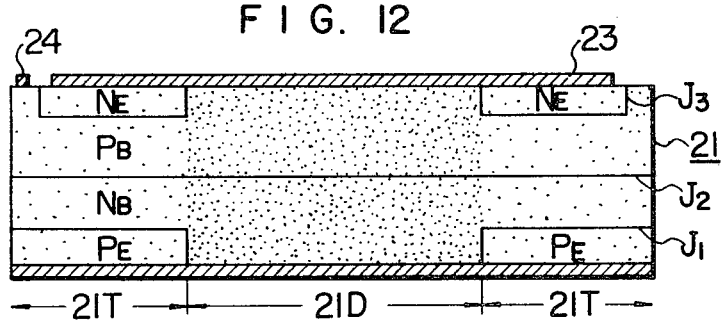

FIG. 12 shows a diode-integrated thyristor as a fourth embodiment of the present invention. In this embodiment, the diode region 21D and the thyristor region 21T are disposed adjacent to each other and both of them are doped with the same material for forming a recombination center, the concentration of the doped material being higher in the diode region 21D than in the thyristor region 21T. This embodiment has the same function as the second one and can be operated at a higher speed. It is possible also in this embodiment to provide various modifications in view of the second embodiment.

Figure 13:
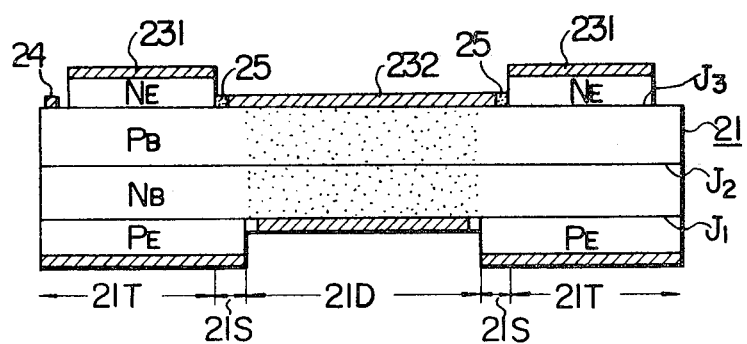

FIG. 13 shows a diode-integrated thyristor as a fifth embodiment of the present invention. In this case embodiment, as shown in the figure, the diode region 21D is made thinner by the width of the P emitter layer $P_E$ plus the N emitter layer $N_E$ than the thyristor region and each of the main electrodes 22 and 23 is split into the electrode portions respectively for the diode and thyristor regions, and the diode region 21D is doped with the material for forming a recombination center. Oxide films 25 are provided around the peripheries of the electrode portions of the diode region. Moreover, in this embodiment, the isolation portion 21S is formed by extending the P emitter layer $P_E$ onto the surface of the N base layer of the diode region but it can also be formed in various manners described with the first embodiment. Further, only the diode region is doped with a material for forming a recombination center but it is also possible for the whole substrate to be doped with the same material so that the concentration of the material may be higher in the diode region than in the thyristor region. Also, the isolation portion 21S formed between the diode and thyristor regions 21D and 21T is not always needed, depending upon the field of application. Furthermore, the relative structures of the diode and thyristor regions are not limited to those shown in FIG. 13 in which the diode region 21D is surrounded by the thyristor region 21T, but it is possible either to surround the thyristor region 21T by the diode region 21D or to dispose the regions adjacent side by side to each other.

In the preceding embodiments and their modified forms, for the purpose of making the life time of the carriers in the diode region shorter than that of the carriers in the thyristor region, only the diode region is doped with a material to form a recombination center or the whole substrate is doped with the same material, with the concentration of the doped material in the diode region higher than that of the doped material in the thyristor region. However, other method such as the irradiation of the substrate by neutron rays and the getter effect can also be used for the same purpose. When the substrate is exposed to radiation from radioactive material recombination centers are formed in the substrate. Accordingly, by casting the radiation only upon the diode region or by exposing the whole substrate to the radiation but controlling the times of exposure so that the time of exposure for the diode region may be longer than for the thyristor region, the same effect as in the first to fifth embodiments can be obtained. On the other hand, a thin phosphorus layer or strain layer formed on the surface of the semiconductor substrate has in high temperature atmosphere an effect of a getter in which the atoms of a heavy metal to cause a recombination center in the substrate are absorbed. Therefore, if such a layer if formed on the surfaces of the thyristor region and subjected to heating, the number of the atoms of heavy a metal in the thyristor region is smaller than in the diode region, so that a diode-integrated thyristor having the same effect as in the first to fifth embodiments is obtained.

Moreover, in the preceding embodiments, a gate electrode is provided in the P base layer $P_B$ to fire the thyristor region but the firing means is not limited to one of those described above and shown in the figures. For example, a gate electrode provided on a layer other than the P base layer $P_B$ may be employed or an optical, electromagnetic or mechanical signal which needs no gate electrode may be used instead of an electric signal which must be applied through the gate electrode.

Now, the result attained according to the present invention will be numerically described below.

Figure 1A:
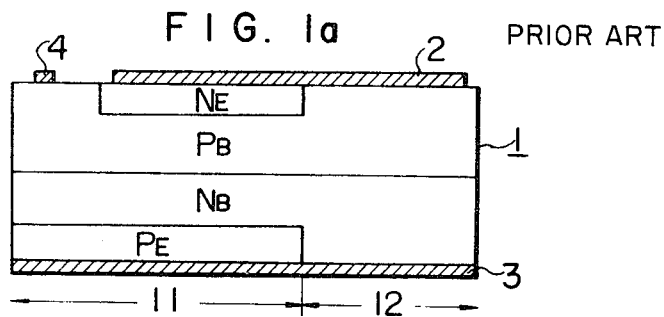
Figure 1B:
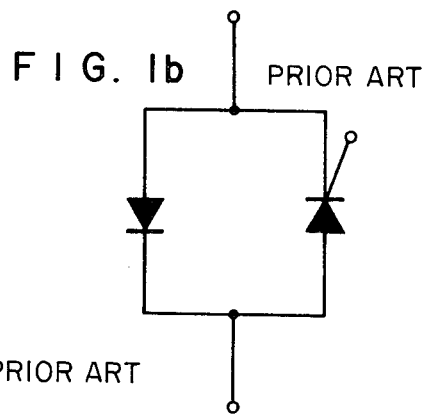
Figure 1C:
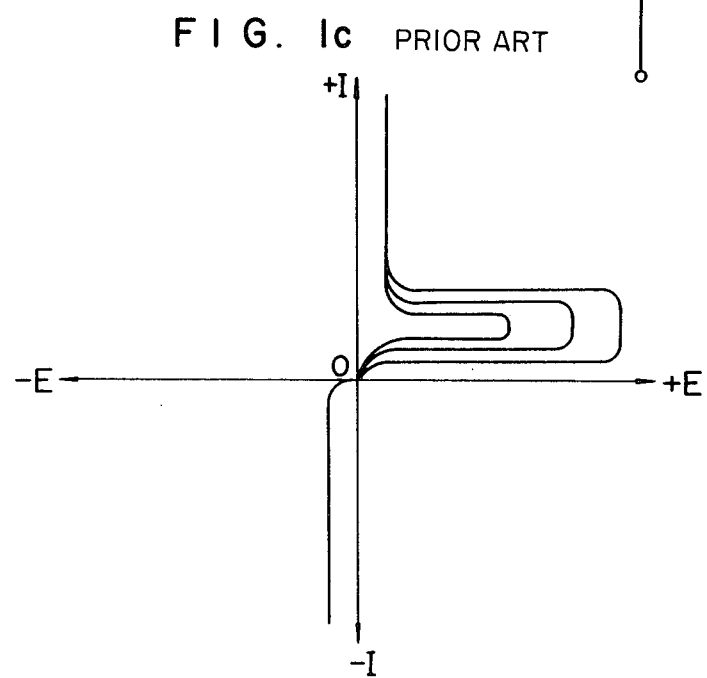
Figure 2:
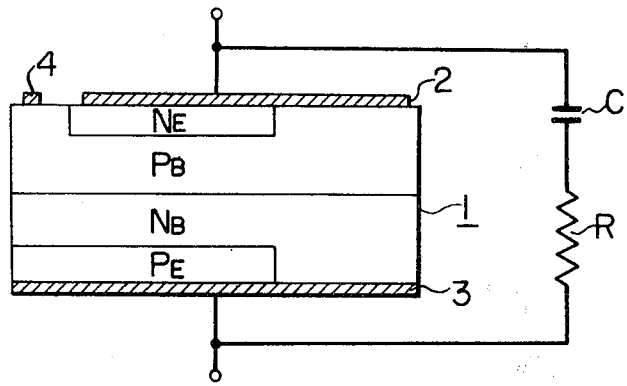

In a diode-integrated thyristor having a structure as shown in FIGS. 2 and 3, operated at the ratings of 1250 V and 400 A, in which the whole substrate is uniformly doped with gold at a concentration of $5 \times 10^{13}$ atoms/cm$^3$, the life time of carriers in either the diode or thyristor region was 10 $\mu$sec. and the rate $dv/dt$ of change in the voltage generated due to the C-R series circuit was 200 – 300 V/$\mu$sec. On the other hand, if the concentration in the diode region is increased up to $1 \times 10^{14}$ atoms/cm$^3$ while that in the thyristor region is kept unchanged, then the life time of carriers in the diode region is 1 – 2 $\mu$sec and the rate $dv/dt$ is 40 – 60 V/$\mu$sec. Thus, if the life time carriers in the diode region is made equal to a third to tenth of that of carriers in the thyristor region, then $dv/dt$ of the voltage generated due to the C-R circuit is reduced by a factor of less than 1/5 so that the maximum allowable temperature of the diode-integrated thyristor can be increased by about 25 %. Moreover, in this case, the undesirable influence on the thyristor region by the residual carriers in the diode region can also be decreased, the commutation capacity can be doubled or the width of the isolation portion can be halved if the capacity is kept constant, and the unevenness of the life times, otherwise lying within a range of 1 to 10 $\mu$sec., can be decreased to 0.5 to 2 $\mu$sec.

What we claim is:

1. A diode-integrated thyristor device comprising:
   i. a semiconductor body having two opposing principle surfaces and four layers of alternate conductivity type including
      a. a first inner layer of a first conductivity type, having a portion exposed to one of said principal surfaces,
      b. a second inner layer of a second conductivity type opposite said first conductivity type, having a portion exposed to the other principal surface and adjoining said portion of said first inner layer, thereby forming a first PN junction which laterally extends throughout said semiconductor body, said first inner layer being highly conductive relative to said second inner layer,
      c. a first outer layer of said second conductivity type, formed in said first inner layer, thereby forming with said first inner layer a second PN junction the edge face of which is exposed to said one principal surface adjacent said portion of said first inner layer, and
      d. a second outer layer of said first conductivity type, formed in said second inner layer at a position opposing to said first outer layer, thereby forming with said second inner layer a third PN junction the edge face of which is exposed to said other principal surface, whereby a four layer region is defined by said four adjacent layers and a two layer region juxtaposed with said four layer region is defined by said portions of said two inner layer;
   ii. a first electrode in ohmic contact with the surfaces of said portion of said first inner layer and said first outer layer, at said one principal surface;
   iii. a second electrode in ohmic contact with the surfaces of said portion of said second inner layer and said second outer layer, at said other principal surface; and
   iv. control electrode means for triggering said device, in contact with the surface of one of said four layers, apart from both said first and second electrodes and said two layer region,
      wherein said four layer region and said first and second electrodes and said control electrode means define a thyristor which conducts current in a first direction,
      said two layer region and said first and second electrodes define a diode rectifier which conducts current in a second direction, and said two layer region has recombination centers distributed therethroughout, the concentration of recombination centers in said two layer region being higher than that in said four layer region.

2. A diode-integrated thyristor device as claimed in claim 1, wherein one of said four layer region and said two layer region surrounds the other of said four layer region and said two layer region.

3. A diode-integrated thyristor device comprising:
 i. a semiconductor body having two opposing principal surfaces and four layers of alternate conductivity type including
  a. a first inner layer of a first conductivity type, having a portion exposed to one of said principal surfaces,
  b. a second inner layer of a second conductivity type opposite said first conductivity type, having a portion exposed to the other principal surface and adjoining said portion of said first inner layer, thereby forming a first PN junction which laterally extends throughout said semiconductor body, said first inner layer being highly conductive relative to said second inner layer,
  c. a first outer layer of said second conductivity type, formed in said first inner layer, thereby forming with said first inner layer a second PN junction the edge face of which is exposed to said one principal surface adjacent said portion of said first inner layer, and
  d. a second outer layer of said first conductivity type, formed in said second inner layer at a position opposing said first outer layer, thereby forming with said second inner layer a third PN junction the edge face of which is exposed to said other principal surface, whereby a four layer region is defined by said four adajcent layers, and a two layer region juxtaposed with said four layer region is defined by said portions of said two inner layers;
 ii. a first electrode in ohmic contact with the surfaces of said portion of said first inner layer and first outer layer, at said one principal surface;
 iii. a second electrode in ohmic contact with the surfaces of said portion of said second inner layer and said second outer layer, at said other principal surface; and
 iv. control electrode means for triggering said device, in contact with the surface of one of said four layers, apart from both said first and second electrodes and said two layer region;
 wherein said two layer region includes an isolation region adjoining said four layer region and separating the remainder of said two layer region from said four layer region, said isolation region having such a large distance that a load current is prevented substantially from flowing in said isolation region and the charge concentration due to current flow in said remainder of said two layer region does not substantially extend into said four layer region,
 said four layer region and said first and second electrodes and said control electrode means define a thyristor which conducts current in a first direction, and said remainder of said two layer region and said first and second electrode means define a diode rectifier which conducts current in a second direction and said remainder of said two layer region has recombination centers distributed therethroughout, the concentration of recombination centers in said remainder of said two layer region being higher than that in said four layer region.

4. A diode-integrated thyristor device as claimed in claim 3, wherein said second outer layer has an extension extending through said isolation region in said portion of said second inner layer to said remainder of said two layer region, whereby said isolation region is defined by said two inner layers and said extension.

5. A diode-integrated thyristor device as claimed in claim 4, wherein one of said four layer region and said two layer region surrounds the other of said four layer region and said two layer region.

6. A diode-integrated thyristor device as claimed in claim 3, wherein said remainder of said two layer region has a layer of said second conductivity type, exposed to said other principal surface, said layer being higher in conductivity relative to the adjoining exposed portion of said isolation region.

7. A diode-integrated thyristor device as claimed in claim 6, wherein one of said four layer region and said two layer region surrounds the other of said four layer region and said two layer region.

8. A diode-integrated thyristor device as claimed in claim 3, wherein the thickness of at least one of said first inner layer and said second inner layer belonging to said isolation region is less than those belonging to said remainder of said two layer region and said four layer region.

9. A diode-integrated thyristor device as claimed in claim 8, wherein one of said four layer region and said two layer region surrounds the other of said four layer region and said two layer region.

10. A diode-integrated thyristor device as claimed in claim 3, wherein said isolation region has recombination centers the concentration of which is higher than that in said remainder of said two layer region.

11. A diode-integrated thyristor device as claimed in claim 10, wherein one of said four layer region and said two layer region surrounds the other of said four layer region and said two layer region.

12. A diode-integrated thyristor device comprising:
 i. a disc-shaped semiconductor body having two opposing principal surfaces and including
  a. a first inner layer of a first conductivity type having a first portion exposed to one of said two opposing principal surfaces,
  b. a second inner layer of a second conductivity type, opposite said first conductivity type, having a first portion exposed on the other of said two opposing principal surfaces and disposed in contact with said first inner layer and defining therewith a first PN junction which extends laterally throughout said body,
  c. a first ring-shaped outer layer of said second conductivity type, formed in said first inner layer and defining therewith a second PN junction which terminates at said one principal surface and adjoins said first portion of said first inner layer;
  d. a second outer layer of said first conductivity type, formed in said second inner layer and defining therewith a third PN junction, an edge portion of which terminates at said other principal surface, adjoins said first portion of said second inner layer, and is circularly shaped;

ii. a first electrode in ohmic contact on said one principal surface with said first portion of said first inner layer and with the surface of said first outer layer;

iii. a second electrode in ohmic contact on said other principal surface with said first portion of said second inner layer and with the surface of said second outer layer; and iv. control means, coupled to one of the first and second inner layers, for supplying a trigger signal thereto; and wherein a four layer body region is defined by those portions of each of said inner and outer layers, the projections of which onto said principal surfaces overlap one another, a two layer body region is defined by those portions of each of said inner layers exclusive of said outer layers, the projections of which onto said principal surfaces overlap one another, o said four layer body region, said first and second electrodes and said control means defining a thyristor which conducts current through said body in a first direction, said two layer body region and said first and second electrodes defining a diode rectifier which conducts current through said body in a second direction, opposite said first direction, an isolation body region is defined by those portions of each of said inner layers and said second outer layer, the projections of which onto said principal surfaces overlap one another adjoin both said four layer body region and said two layer body region, and said two layer body region and said isolation body region contain recombination centers distributed therethroughout to a concentration higher than that of recombination centers in said four layer body region.

13. A diode-integrated thyristor device according to claim 12, wherein said second outer layer is ring-shaped.

14. A diode-integrated thyristor device according to claim 12, wherein said second outer layer is disc-shaped.

15. A diode-integrated thyristor device comprising:

i. a disc-shaped semiconductor body having two opposing principal surfaces and including a. a first inner layer of a first conductivity type having a first portion exposed to one of said two opposing principal surfaces, b. a second inner layer of a second conductivity type, opposite said first conductivity type, having a first portion exposed to the other of said two opposing principal surfaces and disposed in contact with said first inner and defining therewith a first PN junction which extends laterally throughout said body, c. a first ring-shaped outer layer of said second conductivity type, formed in said first inner layer and defining therewith a second PN junction which terminates at said one principal surface and adjoins said first portion of said first inner layer;

d. a second outer layer of said first conductivity type, formed in said second inner layer and defining therewith a third PN junction, an edge portion of which terminates at said other principal surface, adjoins said first portion of said second inner layer, and is circularly-shaped;

ii. a first electrode in ohmic contact on said one principal surface with said first portion of said first inner layer and with the surface of said first outer layer;

iii. a second electrode in ohmic contact on said other principal surface with said first portion of said second inner layer and with the surface of said second outer layer; and iv. control means coupled to one of the first and second inner layers, for supplying a trigger signal thereto; and wherein a four layer body region is defined by those portions of each of said inner and outer layers, the projections of which onto said principal surfaces overlap one another.

a two layer body region is defined by those portions of each of said inner layers exclusive of said outer layers, the projections of which onto said principal surfaces overlap one another, said four body region, said first and second electrodes and said control means defining a thyristor which conducts current through said body in a first direction, said two layer body region and said first and second electrodes defining a diode rectifier which conducts current through said body in a second direction, opposite said first direction, a portion of second inner layer within said two layer body region includes a first surface region of said second conductivity type and having an impurity concentration greater than the remainder of said second inner layer, disposed in said second principal surface of said body, and said two layer body region including said first surface region contains recombination centers distributed therethroughout to a concentration higher than that of recombination centers in said four layer body region.

16. A diode-integrated thyristor device according to claim 15, wherein a portion of said first inner layer within said two layer body region includes a second surface region of said first conductivity type and having an impurity concentration greater than the remainder of said first inner layer, disposed in said first principal surface of said body.

17. A diode-integrated thyristor device according to claim 16, wherein said second outer layer is ring-shaped and said first and second surface regions are disc-shaped.

18. A diode-integrated thyristor device according to claim 15, wherein said second outer layer is disc-shaped and said first surface region is ring-shaped.

* * * * *